United States Patent [19]

Czubarow et al.

[11] Patent Number: 5,720,859
[45] Date of Patent: Feb. 24, 1998

[54] METHOD OF FORMING AN ELECTRODE ON A SUBSTRATE

[75] Inventors: Pawel Czubarow, Menlo Park; Ryan Dupon, San Carlos; Anthony Evans, Woodside; Viktors Jansons, Los Gatos, all of Calif.

[73] Assignee: Raychem Corporation, Menlo Park, Calif.

[21] Appl. No.: 846,898

[22] Filed: May 1, 1997

Related U.S. Application Data

[63] Continuation of Ser. No. 657,142, Jun. 3, 1996, abandoned.
[51] Int. Cl.[6] ................................ C01G 1/00; B05D 3/00
[52] U.S. Cl. ..................... 204/157.43; 427/553; 75/10.13
[58] Field of Search .......................... 204/157.15, 157.43; 427/553; 75/10.13

[56] References Cited

U.S. PATENT DOCUMENTS

| | | | |
|---|---|---|---|
| 928,398 | 7/1909 | Patterson et al. | 148/533 |
| 934,704 | 9/1909 | Zieme | 427/227 |
| 1,197,693 | 9/1916 | Watkins | 427/211 |
| 2,429,088 | 10/1947 | Box | 117/16 |
| 4,188,651 | 2/1980 | Dornfeld et al. | 361/322 |
| 4,212,045 | 7/1980 | Martzloff | 361/127 |
| 4,271,045 | 6/1981 | Steigerwald et al. | 252/511 |
| 4,311,520 | 1/1982 | Kruesi et al. | 75/80 |
| 4,321,089 | 3/1982 | Kuresi et al. | 75/84.5 |

(List continued on next page.)

FOREIGN PATENT DOCUMENTS

| | | |
|---|---|---|
| 0 534 775 A1 | 3/1993 | European Pat. Off. . |
| 1700071 A1 | 12/1991 | U.S.S.R. . |
| 1126250 | 9/1968 | United Kingdom . |
| 2 059 681 | 4/1981 | United Kingdom . |
| WO 89/04379 | 5/1989 | WIPO ................ C22B 5/10 |

OTHER PUBLICATIONS

L'vov et al. Izv. Vyssh. Uchebn. Zaved., Chem. Metall. (1988), (9), pp. 10–13 no month available.
Mechev, Metally (1994), (1), pp. 41–45 no month available.
Vaidhyanathan et al., Chem. Mater. 1997 (9), pp. 1196–1200.
Ramesh et al., J. Mater. Res., vol. 9, No. 12, Dec. 1994, pp. 3025–3027.
Xu et al., J. Mater. Res., vol. 10, No. 2, Feb. 1995, pp. 334–338.
Sakai et al., Shigen to Sozai (1993), 109(8), 645–50 no month avialable.
Standish et al., Iron Steelmaker, 18(5), pp. 59–61 (May 1991).
L'vov et al., Zh. Anal. Khim. (1984), 39(10), pp. 1773–1780 no month available.
Sutton, Ceramic Trans., vol. 36, pp. 3–18 (1993) no month avialable.
Sutton, Ceramic Bull., Vol. 68, No. 2, pp. 376–386 (1989) no month available.
Tian, Ceramic Trans., vol. 21, pp. 283–300 (1991) no month avialable.
Shafizadeh, in Adv. Carbohydrate Chemistry, vol. 23, pp. 419–474 (Wolfrom et al., eds., Academic Press 1968) no month available.
Sun et al., IEEE Trans. Electron Devices, vol. ED–23, No. 8, pp. 961–966 (Aug. 1976).
Kumar et al., Ceramic Transactions, vol. 21, pp. 395–402 (1991) no month available.

*Primary Examiner*—Kathryn L. Gorgos
*Assistant Examiner*—Edna Wong
*Attorney, Agent, or Firm*—Herbert G. Burkard; Yuan Chao

[57] ABSTRACT

An electrode is formed on a substrate such as a varistor, a PTC ceramic, or a piezoelectric ceramic by coating a surface of the substrate with a combination of a metal source and a source of reducing carbon. The substrate and/or the combination is an absorber of microwave radiation. Irradiation with microwave radiation causes a carbothermic reduction to occur, converting the metal source to a metal electrode on the substrate.

26 Claims, 2 Drawing Sheets

U.S. PATENT DOCUMENTS

| | | | |
|---|---|---|---|
| 4,324,582 | 4/1982 | Kruesi et al. | 75/1 R |
| 4,364,021 | 12/1982 | Levinson | 338/20 |
| 4,505,787 | 3/1985 | Fuller et al. | 204/67 |
| 4,514,321 | 4/1985 | Siuta et al. | 252/512 |
| 4,733,018 | 3/1988 | Prabhu et al. | 174/68.5 |
| 4,747,014 | 5/1988 | Kaino et al. | 361/321 |
| 4,987,515 | 1/1991 | Iwaya et al. | 361/321 |
| 5,039,452 | 8/1991 | Thompson et al. | 252/518 |
| 5,062,891 | 11/1991 | Gruber et al. | 106/20 |
| 5,091,820 | 2/1992 | Iwaya et al. | 361/304 |
| 5,131,941 | 7/1992 | Lemelson | 75/10.19 |
| 5,321,223 | 6/1994 | Kimrey et al. | 219/745 |
| 5,407,473 | 4/1995 | Miura et al. | 106/20 B |
| 5,410,135 | 4/1995 | Pollart et al. | 219/730 |
| 5,443,560 | 8/1995 | Deevi et al. | 131/359 |
| 5,471,721 | 12/1995 | Haertling | 29/29.35 |
| 5,480,834 | 1/1996 | Lake et al. | 437/183 |

METHOD OF FORMING AN ELECTRODE ON A SUBSTRATE

CROSS-REFERENCE TO RELATED APPLICATIONS

This application is a continuation of application Ser. No. 08/657,142, filed Jun. 3, 1996, now abandoned, the disclosure of which is incorporated herein by reference.

TECHNICAL FIELD OF THE INVENTION

This invention provides a method of forming an electrode on a substrate.

BACKGROUND OF THE INVENTION

Often, metallic electrodes are applied onto a substrate. Where a varistor is used for electrical surge protection, electrodes may be applied to the surfaces where electrical contact is made, to improve such contact and to assure uniform current distribution. See, for example, Thompson et al., U.S. Pat. No. 5,039,452 (1991); Levinson, U.S. Pat. No. 4,364,021 (1982); and Martzloff, U.S. Pat. No. 4,212,045 (1980). Where a ceramic is the dielectric material in a capacitor, its opposing faces may have electrodes applied thereon. See, for example, Iwaya et al., U.S. Pat. Nos. 5,091,820 (1992) and 4,987,515 (1991). Additionally, a metal layer may be applied as a tie layer between a ceramic and another material, such as solder. Herein, "electrode" includes a metal layer used as a tie layer (but not necessarily for such purpose only).

Prior art techniques for forming such electrodes include: (a) thermal or arc spraying of a metal such as aluminum; (b) screen printing of metal-glass frit material followed by firing; (c) sputtering; (d) physical vapor deposition; (e) chemical vapor deposition; (f) coating with a conductive epoxy, such a silver based epoxy ink; and (g) electroless plating.

Each prior art technique has a limitation of one kind or another. Some operate in a vacuum, necessitating expensive equipment. Others yield electrodes which are poorly adherent to the substrate or have low current handling capacity and non-uniform current distribution. Yet others may yield a considerable amount of waste products harmful to the environment or may require long furnace residence times leading to low production rates. Our invention provides an improved method for forming electrodes on an inorganic substrate such as glass or ceramic.

SUMMARY OF THE INVENTION

This invention provides a method of forming a metal electrode on a ceramic or glass substrate, comprising the steps of:

(a) providing (i) a ceramic or glass substrate having a surface on which an electrode is to be formed and (ii) a combination of a metal source and a source of reducing carbon, with the proviso that at least one of the substrate and the combination is an absorber of microwave radiation;

(b) coating the surface on which the electrode is to be formed with the combination; and (c) irradiating the coated substrate with sufficient microwave radiation to effect carbothermic reduction (also referred as carbothermal reduction) of the metal source to metal, thereby forming a metal electrode on the surface of the substrate.

In another embodiment of the invention, a second substrate is placed in contact with the combination on the first substrate. The metal electrode which is formed by the carbothermic reduction process bonds to both substrates, thus coupling them to each other.

Advantages of the invention include rapid and localized metal deposition with minimal reoxidizable metal waste. The resulting electrode is well adhered to the substrate and ensures uniform current distribution during operation of a device, along with higher current density handling capability. The electrode deposition process can be performed at ambient pressure, without the need for expensive vacuum equipment. The invention also assures high production throughput rates due to the efficient microwave-initiated reduction, with its high heating rate.

BRIEF DESCRIPTION OF THE DRAWING(S)

FIG. 1 shows schematically the process of the invention. FIG. 2 shows another embodiment of the invention. FIG. 3 is X-ray diffraction pattern data showing the conversion of copper oxide to copper metal as carbothermal reduction progresses.

DESCRIPTION OF THE PREFERRED EMBODIMENTS

Figure 1:
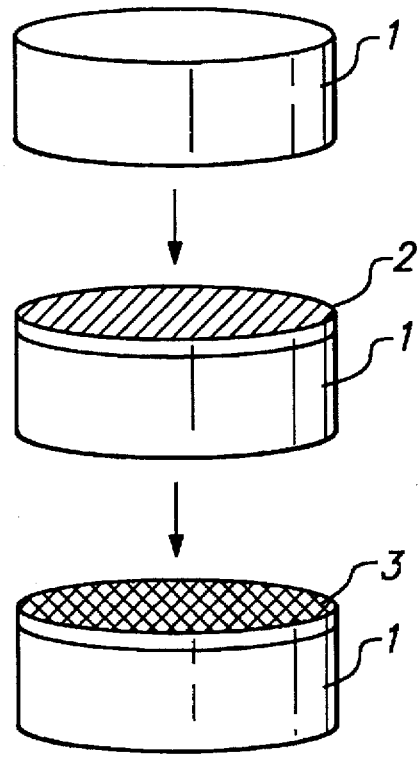

The invention is illustrated in FIG. 1. A combination 2 comprising a metal source and a source of reducing carbon is coated onto a surface of a substrate 1, for example a ceramic or a glass. For the sake of simplicity, only a single contiguous surface is shown as being coated, but it is to be understood that the coated surface may comprise a plurality of disconnected surfaces. The metal source and source of reducing carbon may be applied simultaneously, as an intimate mixture thereof, or sequentially, in layers which are sufficiently thin so that intimate mixing occurs when heating takes place. Then, coated substrate 1 is subjected to a sufficient amount of microwave radiation, which heats it up, and, in turn, combination 2 (assuming combination 2 is not an absorber of microwave radiation). A carbothermic reduction takes place in combination 2, in which the metal source is reduced to metal by carbon in and/or by pyrolysis intermediates generated from the source of reducing carbon, with the carbon being converted to CO or $CO_2$. The result is that a metallic electrode 3 is formed on substrate 1.

Other embodiments of the invention are possible, for example one in which both substrate 1 and combination 2 are microwave absorbing, so that they are simultaneously heated. Alternatively, substrate 1 is not microwave absorbing while combination 2 is, so that the microwave radiation heats up the latter.

Carbothermal reduction is one of the oldest reactions known to man. It entails a reaction between a metal source such as a metal oxide and carbon, where the carbon is oxidized to carbon dioxide (or carbon monoxide) and the metal source is reduced to elemental metal as depicted by equation (1).

$$2M_xO_y + yC \rightarrow 2xM + yCO_2 \tag{1}$$

One of the more desirable electrode materials in electronics industry is copper. Copper electrodes have a low electrochemical ion migration behavior, good solderability, and low material cost. The higher conductivity of copper compared to, for example, Pd—Ag, as a surge conductor makes the electrode less prone to current crowding and delamination during surges. However, conventional copper electrode formation requires firing in atmospheres having oxygen content of less than about 10 ppm. Such reducing conditions result in a change in valence states of metals in ferroelectric ceramic or in dopants present in varistor ceramics, causing the loss of desirable electrical properties. For example, a method of forming electrodes in reducing atmosphere taught by Iwaya et al., U.S. Pat. No. 5,091,820 (1992) and 4,987,515 (1991), applied to varistors results in ceramics with lack of nonlinear electrical properties. However, the rapid localized reduction (e.g., of CuO) in the present invention does not effect the bulk electrical properties of the substrate ceramics.

The terms "absorber of microwave radiation" or "microwave absorbing," when used in respect of the substrate and/or the combination of the metal source and the source of reducing carbon, means that such material absorbs microwave radiation when subjected to microwave radiation and heats up. Preferably, an absorber of microwave radiation has a dielectric constant ($\kappa$) greater than 20 at 3 GHz, more preferably greater than 100 at 3 GHz, and most preferably greater than 600 at 3 GHz. Exemplary microwave absorbing substrates include, without limitation, metal oxide varistors and ferroelectric materials. Among the latter are positive temperature coefficient (PTC) ceramics (ceramics having a resistivity which increases with temperature), barium titanate ceramics, and piezoelectric ceramics.

Figure 2:
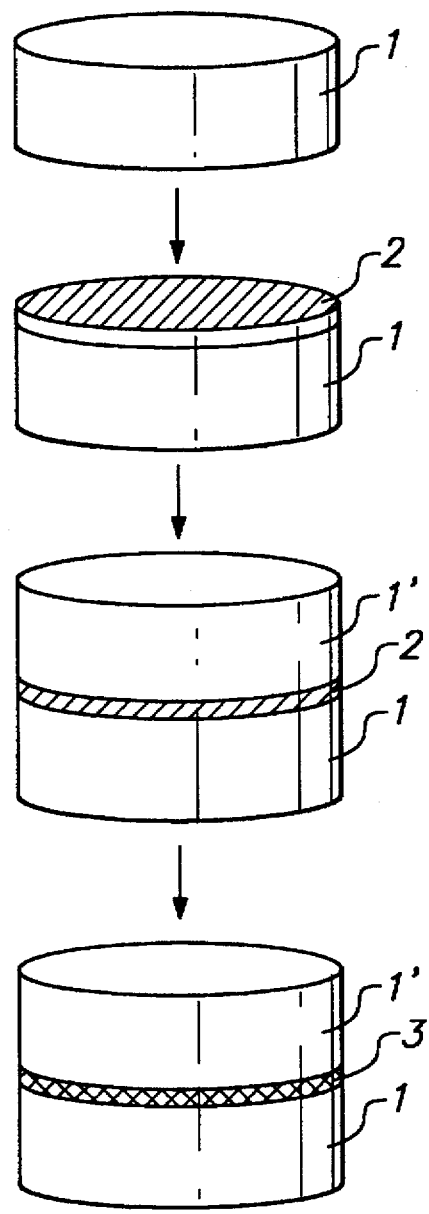

FIG. 2 illustrates another embodiment of this invention. After combination 2 is applied onto the surface of substrate 1, a second substrate 1' is placed against an exposed portion of combination 2, sandwiching at least part of combination 2 between substrates 1 and 1'. After carbothermic reduction, the resulting electrode 3 bonds to both substrates 1 and 1', coupling them to each other. Substrates 1 and 1' can but need not be of the same material or size or shape. Preferred pairings of dissimilar materials as substrates 1 and 1' include varistor-PTC ceramic and varistor piezoelectric ceramic.

A preferred metal oxide varistor is a polycrystalline sintered ceramic with zinc oxide (ZnO) or strontium titanate ($SrTiO_3$) as the primary metal oxide and minor amounts of other metal oxides (as the additive metal oxides), such as $Al_2O_3$, $B_2O_3$, BaO, $Bi_2O_3$, CaO, CoO, $Co_3O_4$, $Cr_2O_3$, FeO, $In_2O_3$, $K_2O$, MgO, $Mn_2O_3$, $Mn_3O_4$, $MnO_2$, NiO, PbO, $Pr_2O_3$, $Sb_2O_3$, $SiO_2$, SnO, $SnO_2$, SrO, $Ta_2O_5$, $TiO_2$, or combinations thereof. A metal oxide varistor is also referred to as a non-linear resistor because it exhibits a nonlinear current-voltage relationship. If the applied voltage is less than a certain voltage (the switching or clamping voltage) the varistor is essentially an insulator and only a small leakage current flows therethrough. If the applied voltage is greater than the switching voltage, the varistor resistance drops, allowing an increased current to flow therethrough. That is, a varistor is highly resistive below its switching voltage and substantially conductive thereabove. The voltage-current relationship of a varistor is described by equation (2).

$$I = \left(\frac{V}{C}\right)^{\alpha} \quad (2)$$

where I is the current flowing through the varistor; V is the voltage across the varistor; C is a constant which is a function of the dimensions, composition, and method of fabrication of the varistor; and $\alpha$ (alpha) is a constant which is a measure of the nonlinearity of the varistor. A large $\alpha$, signifying a large degree of nonlinearity, is desirable.

In a preferred method for making varistor materials for use in this invention, soluble salt precursors of the additive metal oxides are converted to the respective oxides and hydroxides in the presence of zinc oxide powder by a precipitant, commonly ammonium hydroxide. Preferably, the additive metal oxides or their precursors are combined with the zinc oxide, and then the precipitant is added to the mixture, although the reversed mixing sequence may also be used. The additive metal oxides precipitate onto or around the zinc oxide, to form a precursor powder which is an intimate mixture of zinc oxide and the additive metal oxides. The precursor powder is collected, dried, and formed into a desired shape (the green body) and sintered at an elevated temperature (typically 1,000° to 1,400° C.) to develop the characteristic polycrystalline microstructure responsible for the varistor properties. During the sintering, any hydroxides are converted to the corresponding oxides. Eda et al., Japanese laid-open application no. 56-101711 (1981) and Thompson et al., U.S. Pat. No. 5,039,452 (1991), the disclosures of which are incorporated herein by reference, disclose suitable precipitation processes.

Other disclosures relating varistor materials which may be used include Matsuoka et al., U.S. Pat. No. 3,496,512 (1970); Eda et al., U.S. Pat. No. 4,551,268 (1985); and Levinson, U.S. Pat. No. 4,184,984 (1980). Additionally, varistor materials based on materials other than zinc oxide may also be used, for example titanium oxide, strontium oxide, or strontium titanate varistors.

Another class of suitable substrates are ferroelectric materials, which have a spontaneous electric dipole moment because, in the crystal structure, the center of the positive charge does not coincide with the center of the negative charge. The commonest ferroelectric crystal structures are perovskite, ilmenite, and pyrochlorite. In general all ferroelectric materials have high dielectric constant and hence should absorb microwave radiation well.

Among the ferroelectric materials, a preferred type is a PTC ceramic. The PTC effect is found in certain ferroelectric titanate ceramics. The change in resistivity is associated with the change in grain boundary Schottky barriers as the material undergoes phase transition from a low temperature ferroelectric state to a high temperature paraelectric state. The temperature at which the resistivity sharply increases is the Curie temperature, and can be adjusted by Sr or Pb substitution for Ba. Sr substitution decreases the Curie temperature, while Pb substitution increases it. Undoped barium titanate is an insulating material because of its large energy gap. The resistivity is lowered by donor doping. The dopants are usually trivalent ions for the Ba site ($Y^{3+}$ and $La^{3+}$) and pentavalent ions for the Ti site ($Nb^{5+}$, $Ta^{5+}$ and $Sb^{5+}$). The dopants also affect grain growth. Sintering aids are added to lower the sintering temperature. Excess $TiO_2$ can result in a eutectic temperature of 1,317° C. Addition of a small amount of $SiO_2$ can lower the eutectic to 1,250° C. The addition of $SiO_2$ also improves the wetting characteristics of the liquid phase, which is critical in distributing dopants and other additives such as barrier layer modifiers more uniformly. Another frequently used sintering aid is ATS ($Al_2O_3$, $TiO_2$ and $SiO_2$).

Ceramic PTC devices are usually heated at a slow rate up to 600° C. to ensure complete binder removal. The heating rate can be increased to a temperature of about 1,250° C., depending on the presence of liquid forming sintering aids. Often, the samples are held at the onset of a liquid phase for a very short period of time for grain nucleation. Then, the samples are quickly brought to the peak firing temperature (1,300° to 1,400° C.) and held there long enough to allow donor incorporation, densification and grain growth to occur. Upon cooling, oxidation occurs quickly along grain boundaries in the temperature range between 1,250° and 1,000° C. Annealing is usually done during cooling and is important for the distribution of barrier layer modifiers (counter dopants). Disclosures relating to suitable PTC materials include Fujikawa U.S. Pat. No. 4,014,822 (1977) and Malcoto, JP 4-104,949 (1992).

A preferred PTC ceramic is a polycrystalline sintered ceramic of barium titanate ($BaTiO_3$) (the primary oxide) doped with minor amounts of other metal oxides (the additive metal oxides) such as $Y_2O_3$, $La_2O_3$, $Nb_2O_5$, $Ta_2O_5$, $Sb_2O_5$, or combinations thereof.

Non-PTC barium titanate ceramic (i.e., which has not been doped to give it PTC properties and commonly found in capacitors), can also be used as a substrate. Such barium titanate is usually modified with isovalent substituents and donor and acceptor dopants. Ions having similar size to $Ba^{2+}$ or $Ti^{4+}$, such as $Sr^{2+}$ or $Pb^{4+}$, can be substituted in the perovskite structure for barium or titanium. For example, incorporation of $Sr^{2+}$, $Zr^{4+}$, $Hf^{4+}$, or $Sn^{4+}$ will reduce the Curie temperature while $Ca^{2+}$ will broaden the peak in the dielectric constant at the Curie temperature. In the case $BaTiO_3$—$BaZrO_3$ solid solutions, $Zr^{4+}$ is believed to raise the peak value of the dielectric constant. Acceptor dopants are ions which behave as electron acceptors with lower charge than $4^+$ and substitute for Ti site. The solubility of these ions is usually less than few tenths of a percent. Acceptor dopants such as $Mn^{2+}$, $Mn^{3+}$, $Co^{2+}$, $Co^{3+}$, $Fe^{2+}$, $Fe^{3+}$, $Ni^{2+}$, and $Zn^{2+}$ induce vacancies in the oxygen sublattice, causing electronic oxygen ion migration in a DC field leading to capacitor failure. They also produce decreases in alternating current voltage loss of $BaTiO_3$ but increases in the aging rate. Donor dopants (Ti substitutes) such as $Nd^{3+}$, $Nb^{5+}$, $Ta^{5+}$, or $W^{6+}$, on the other hand, can neutralize acceptor impurities and remove the impurity-related oxygen vacancies.

Another type of ferroelectric materials are piezoelectric ceramics, which develop an induced electric potential upon application of pressure and are used in sensors and actuators. A preferred piezoelectric ceramic is of the lead zirconate titanate (PZT) solid solution ($Pb(Zr, Ti)O_3$) type, optionally containing small amounts of $La_2O_3$. When the applied electric field is small, the induced strain is nearly proportional to the electric field. However, as the field increases to greater than about 0.1 kV/mm, the strain curve deviates from linearity and a significant hysteresis is exhibited due to polarization reversal.

Another type of suitable substrates are negative temperature coefficient (NTC) materials, which have a resistivity which decreases with temperature. These are typically formed from oxides having a spinel crystal structure and commonly based on the chemical formula $NiMn_2O_4$. Most NTC thermistors are solid solutions in the oxide system (Mn, Ni, Fe, Co, $Cu)_3O_4$. Materials of this type possess high temperature coefficients ($B=E_a/k=3,000°$ to $4,500°$ K.) with excellent stability of the temperature dependent electrical resistivity. Other NTC materials include titanium doped $Fe_2O_3$ and lithium doped (Ni, Co)O. The conduction mechanism is based on existence of ions of different valences in octahedral B-sites ($A^{2+}B^{3+}_2O_4$). The principal application of NTC materials is in precise temperature measurement and control devices.

Ceramics having a resistivity which varies with the ambient concentration of water vapor or other gas also can be used as substrates. Such materials are produced from a variety of oxides including $SnO_2$, ZnO, $MgCr_2O_4$, and $ZnCr_2O_4$ and are used in humidity and gas sensors. Their resistivity is controlled by the electrical junction at the grain boundaries. Usually, the n-type sensors are based on ZnO while the p-type sensors are based on $MgCr_2O_4$. Some humidity sensors may include $MgCr_2O_4$—$TiO_2$ spinel solid solution with approximately 30 mole % $TiO_2$. Other humidity sensors may also include $ZnCr_2O_4$—$LiZnVO_4$, $SiO_2$—ZnO as well as zirconia based materials.

As noted above, the substrate need not be a microwave absorber if combination 2 is microwave absorbing. Examples of non-microwave absorbing substrates include alumina, cordierite, silica, glass, mullite, and magnesia.

The metal source is a metal compound which yields elemental metal upon carbothermic reduction from a corresponding oxide, hydroxide, carboxylate, formate, nitrate, nitrite, amine complex, carbonate, or mineral. Herein, "metal" includes both individual metals and combinations or alloys of two or more different metals. Suitable metals whose oxides, hydroxides, etc., can be used include but are not limited to zinc, copper, manganese, chromium, iron, cadmium, cobalt, nickel, bismuth, antimony, tin, lead, silver, gold, platinum, and combinations thereof. Specific minerals suitable as metal sources include malachite ($Cu_2CO_3(OH)_2$), azurite ($Cu_3(CO_3)(OH)_2$), hydrozincite ($Zn_5(CO_3)_2(OH)_6$), rosasite (($Cu_3Zn_2)_2CO_3(OH)_2$), aurichalcite (($Zn_2Cu_5)_5(CO_3)_2(OH)_6$), stibiconite ($Sb_3O_6(OH)$), manganite (MnO(OH)), loseyite (($ZnMn)_7(CO_3)_2(OH)_{10}$), bismutite ((BiO)$_2CO_3$), hydrocerussite ($Pb_3(CO_3)_2(OH)_2$), heterogenite (CoO(OH)), gerhardtite ($Cu_2NO_3(OH)_3$), and combinations thereof. The metal sources should not form carbides upon reaction with carbon source, nor should the resulting metal with any excess carbon which may be present. Preferred metals are gold, platinum, and silver. More preferred are zinc, chromium, iron, cadmium, manganese, and cobalt. Most preferred are tin, copper, lead, antimony, bismuth, and arsenic. Preferred metal sources are zinc oxide, tin oxide, bismuth oxide, and copper oxide. The metal source may optionally contain a small amount of a non-carbide-forming elemental metal such as copper or zinc. The carbothermic reduction is a localized reduction which occurs only where the metal source and the source of reducing carbon are both present in intimate proximity. Thus, zinc oxide used as a metal source will be reduced to zinc metal, while zinc oxide in the bulk of the substrate (as in a zinc oxide varistor) will be substantially unreduced. Minerals are microwave absorbing and can be used in the embodiments in which combination 2 is microwave absorbing.

The source of reducing carbon is a carbon-containing organic or inorganic substance optionally containing hydrogen, oxygen or nitrogen. Its boiling point should be greater than its decomposition temperature at pressures between 0.01 and 2,000 mm Hg. Preferred sources of reducing carbon include carbohydrates such as mono-, oligo- (especially sucrose and dextrose) and polysaccharides, graphite, carbon black, furfuryl alcohol and derivatives thereof, hydrocarbon oligomers and polymers, polyacrylates, polyesters, polyimides, polyamides, stearic acid derivatives, and combinations thereof. It is used in an amount preferably between 1 and 3 equivalents of carbon (relative to oxygen in the metal source). The source of reducing carbon may play a double role as a reductant and as a binder. Carbohydrates, carbon black, and graphite are microwave absorbing and can be used in the embodiments in which combination 2 is microwave absorbing.

Among the foregoing sources of reducing carbon, carbohydrates, carbon black, and graphite are microwave absorbing and can be used in the embodiments of the invention in which combination 2 is microwave absorbing.

Combination 2 may be applied onto substrate 1 by techniques such as spraying, screen printing, brushing, painting, or injection. Normally, it is applied as an organic suspension or, preferably, an aqueous suspension containing a dispersant such as Darvan #7. Then, the carrier medium (organic or aqueous, as the case may be) is permitted to evaporate before carbothermic reduction. The texture of combination 2 as applied is typically that of an ink, a paste, or other spreadable material as appropriate for the coating technique chosen. When applied by screen printing (typical mesh size 100–400), the viscosity should be about the same as for commercial silver inks. Electrode patterns depicting graphics, linguistic or numerical characters, and the like may be applied, especially with screen printing techniques.

The microwave energy may be applied at a frequency between 0.50 and 90 GHz. Convenient frequencies are 2.45 GHz or 0.915 GHz, which are set aside by the Federal Communications Commission for industrial, scientific, and medical applications. The applied power can range between 10 and 15,000 W. The time of irradiation depends on power applied, sample size, sample geometry, the number of samples, and other similar parameters and varies between 10 see and 60 min. Preferably, the carbothermic reduction process leaves very little residual carbonaceous material, less than 10 wt % and more preferably less than 5 wt %, in the electrode, with preferably over 90 wt % and more preferably over 95 wt % of the electrode being metal.

The present invention can be used to make surge arresters, capacitors, PTC devices, NTC devices, piezoelectric devices, humidity sensors, gas sensors, and other devices where an electrode is disposed on a ceramic or glass substrate.

The invention may be understood further by reference to the following examples, which are provided for the purposes of illustration and not limitation.

EXAMPLE 1

A blend of 15.0 g CuO (American Chemet Corp.), ball milled to an average particle size less than 2 μm, and 8.07 g sucrose (MC/B) was suspended in 20 mL of distilled water containing 5 drops of Darvan #7 dispersant. The suspension was concentrated using a rotary evaporator. The resulting thick ink was then printed on ZnO varistor substrate disks (42 mm diameter, 4.6 mm high) using a 200 mesh screen. Coated varistor disks were subsequently placed in a glass chamber purged with nitrogen (15 psi) within a microwave cavity (Tappan). Samples were irradiated while spinning (2.45 GHz at 1.1 kW for 1 or 2 min). The resulting electrode appeared to be well adhered and based on the elemental analysis (Galbraith Laboratories) electrodes comprised 5.89 wt % carbon and 88.63 wt % copper after 1 min irradiation and 6.48 wt % carbon and 96.23 wt % copper after 2 min irradiation.

Figure 3:
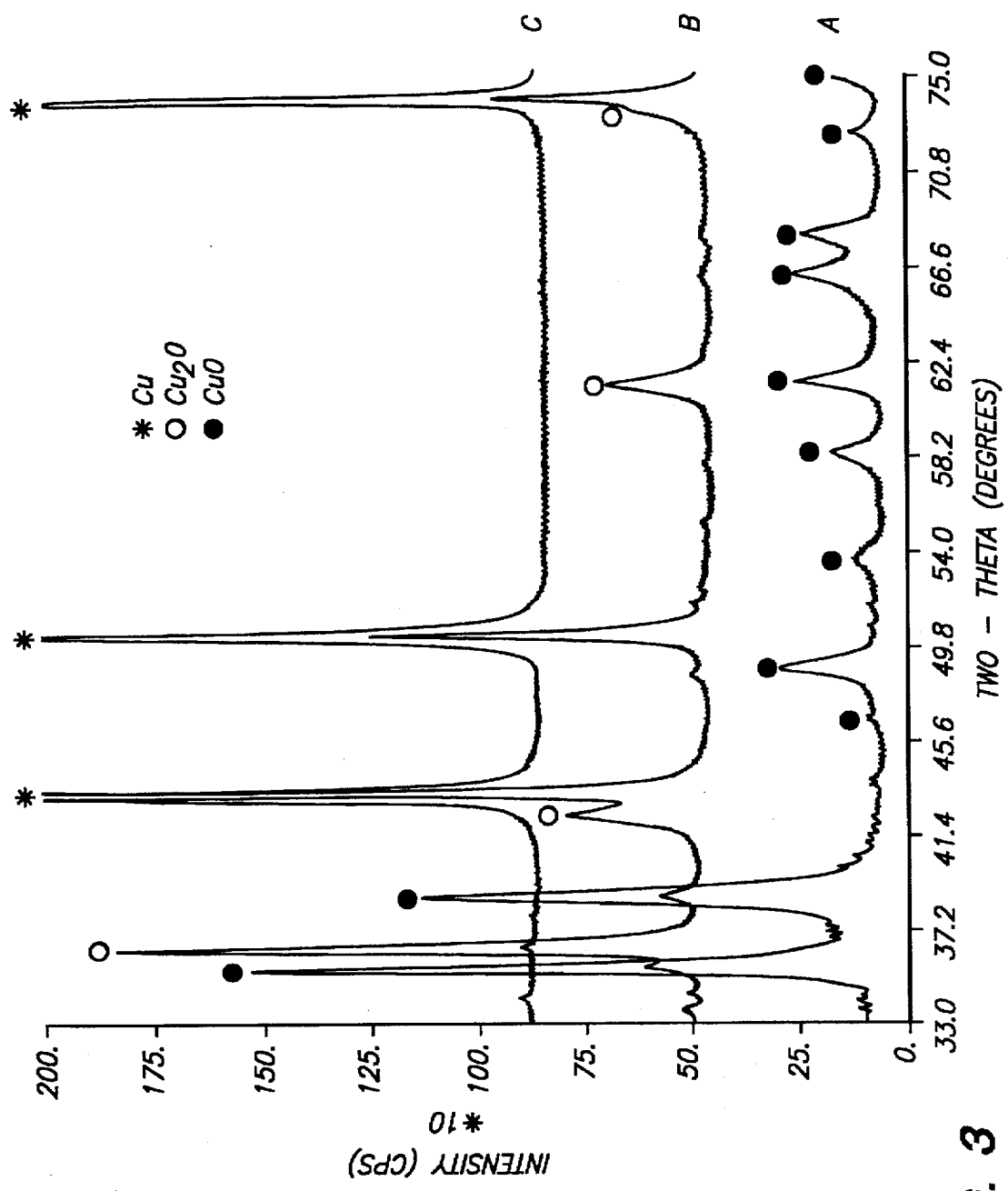

FIG. 3 shows the X-ray diffraction patterns as carbothermic reduction progresses and the copper oxide is converted to metallic copper. The first trace, labeled A, was made before the beginning of microwave irradiation and shows that copper initially is present substantially as cupric oxide (CuO). The second trace, labeled B and made after 1 min of irradiation, shows conversion to the cupric oxide to an intermediate cuprous oxide ($Cu_2O$) along with some copper metal (Cu). The third trace, labeled C and made after 2 min of irradiation, shows essentially complete conversion to copper metal.

EXAMPLE 2

A blend of 15.0 g CuO (American Chemet Corp.), ball milled to an average particle size less than 2 μm, and 5.38 g sucrose (MC/B) was suspended in 20 mL of distilled water containing 6 drops of Darvan #7 dispersant. Following Example 1, the suspension was concentrated and coated onto ZnO varistor disks and the coated disks were irradiated with microwave radiation (2.45 GHz at 1.1 kW for 1 min). The final electrode appeared to be very well adhered and based on the elemental analysis (Galbraith Laboratories) the electrode comprised 3.90 wt % carbon and 93.97 wt % copper.

EXAMPLE 3

A blend of 12.0 g CuO (American Chemet Corp.), ball milled to an average particle size less than 2 μm, 3.0 g Cu (Alfa), and 8.07 g sucrose (MC/B) was suspended in 20 mL of distilled water containing 6 drops of Darvan #7 dispersant. Following Example 1, the suspension was concentrated and coated onto ZnO varistor disks, and the coated disks were irradiated with microwave radiation (2.45 GHz at 1.1 kW for 1 min). The final electrode appeared to be very well adhered and based on the elemental analysis (Galbraith Laboratories) electrode comprised 6.85 wt % carbon and 92.97 wt % copper.

EXAMPLE 4

A blend of 15.0 g CuO (American Chemet Corp.), ball milled to an average particle size less than 2 μm, and 8.07 g sucrose (MC/B) was suspended in 20 mL of distilled water containing 5 drops of Darvan #7 dispersant. The suspension was concentrated using a rotary evaporator. The thick ink was then printed on $BaTiO_3$ PTC substrate disks (10 mm diameter, 2 mm high) using 325 mesh screen. Coated PTC substrate disks were placed in a glass chamber purged with nitrogen (15 psi) within a microwave cavity (Tappan). The samples were irradiated while spinning (2.45 GHz at 1.1 kW for 30 sec). The final electrode appeared to be very well adhered and the contact resistance of the disks dropped from about 4MΩ (without electrode) to about 0.2 kΩ (with Cu electrode).

EXAMPLE 5

A blend of 15.0 g CuO (American Chemet Corp.), ball milled to an average particle size less than 2 μm, and 8.07 g sucrose (MC/B) was suspended in 20 mL of distilled water containing 5 drops of Darvan #7 dispersant. The suspension was concentrated using a rotary evaporator. The thick ink was then printed on ZnO varistor substrate disks (10.3 mm diameter, 2.3 mm high) using 200 mesh screen. Coated varistor disks were stacked on top of each other (with ink located between disks) and placed in a glass chamber purged with nitrogen (15 psi) within the microwave cavity (Tappan). The samples were irradiated while spinning (2.45 GHz at 1.1 kW for 1 min). Disks appeared to be very well adhered. About 21 lb of force was required to debond the fused disks.

EXAMPLE 6

A blend of 5.0 g CuO (American Chemet Corp.), ball milled to an average particle size less than 2 μm, 2.69 g sucrose (MC/B), 2.5 g $Bi_2O_3$ (Baker), and 1.5 g glass frit (EG 2735 VEG from Ferro Corp.) was suspended in 20 mL distilled water containing 6 drops of Darvan #7 dispersant. Following the procedure of Example 5, the suspension was concentrated and printed onto ZnO varistor disks and the disks were stacked on top of each other and irradiated with microwave radiation. The disks appeared to be very well adhered. About 20 lb of force was required to debond the fused disks.

EXAMPLE 7

The procedure of Example 6 was repeated, except that the glass frit was EG 2783 SRRG from Ferro Corp. The stacked disks appeared to be very well adhered to each other after irradiation. About 9 lb of force was required to debond the fused disks.

EXAMPLE 8

A blend of 5.0 g CuO (American Chemet Corp.), ball milled to an average particle size less than 2 μm, 2.69 g sucrose (MC/B), and 5.0 g $Bi_2O_3$ (Baker) was suspended in 20 mL of distilled water containing 6 drops of Darvan #7 dispersant. Following Example 1, the suspension was concentrated and coated onto ZnO varistor disks and the coated disks were irradiated with microwave radiation (2.45 GHz at 1.1 kW for 1, 3, or 5 minutes). The final electrode appeared to be very well adhered and based on the elemental analysis (Sequoia Analytical) the electrode comprised:

| Element | Microwave Irradiation time | | |
| --- | --- | --- | --- |
| | 1 min | 3 min | 5 min |
| Copper (wt %) | 36 | 33 | 41 |
| Bismuth (wt %) | 59 | 65 | 60 |

EXAMPLE 9

A blend of 5.0 g CuO (American Chemet Corp.), ball milled to an average particle size less than 2 μm, 0.25 g sucrose (MC/B), and 0.75 g carbon black (Raven 430 Ultra) was suspended in 20 mL of distilled water containing 6 drops of Darvan #7 dispersant. Following Example 1, the suspension was concentrated and coated onto ZnO varistor disks and the coated disks were irradiated with microwave radiation (2.45 GHz at 1.1 kW for 5 minutes). The final electrode appeared to be well adhered and based on the elemental analysis (Sequoia Analytical) the electrode comprised of 76% copper.

EXAMPLE 10

A blend of 5.0 g SnO (Baker) and 1.06 g sucrose (MC/B) was suspended in 10 mL distilled water. The suspension was concentrated using a rotary evaporator. The resulting thick ink was printed on cordierite (not a microwave absorber) substrate disks (21.5 mm diameter, 2.3 mm high) using a 100 mesh screen. Coated cordierite disks were subsequently placed in a glass chamber purged with nitrogen (15 psi) within a microwave cavity (Tappan). Samples were irradiated while spinning (2.45 GHz at 1.1 kW for 2.5 min). The resulting electrode appeared to be well adhered and based on the elemental analysis (Sequoia Analytical) the electrode comprised of 27% tin.

EXAMPLE 11

A blend of 5.0 g CuO (American Chemet Corp.), ball milled to an average particle size less than 2 μm, 6.17 g of furfuryl alcohol (Aldrich), and 7 drops of Darvan #7 dispersant. Following Example 1, the suspension was concentrated and coated onto ZnO varistor disks and the coated disks were irradiated with microwave radiation (2.45 GHz at 1.1 kW for 3 or 5 minutes). The final electrode appeared to be well adhered and based on the elemental analysis (Sequoia Analytical) the electrode comprised of 79% copper after 3 min irradiation and 84% copper after 5 min irradiation.

EXAMPLE 12

A blend of 3.5 g malachite ($CU_2CO_3(OH)_2$) from Zaire and 0.45 g sucrose (MC/B) was suspended in 10 mL of distilled water containing 6 drops of Darvan #7 dispersant. Following Example 1, the suspension was concentrated and coated onto ZnO varistor disks and the coated disks were irradiated with microwave radiation (2.45 GHz at 1.1 kW for 1, 2, or 5 minutes). The final electrode appeared to be very well adhered and based on the elemental analysis (Sequoia Analytical) the electrode comprised of 67% copper after 1 min irradiation, 79% copper after 2 min, and 90% copper after 5 min.

The foregoing detailed description of the invention includes passages which are chiefly or exclusively concerned with particular parts or aspects of the invention. It is to be understood that this is for clarity and convenience, that a particular feature may be relevant in more than just passage in which it is disclosed, and that the disclosure herein includes all the appropriate combinations of information found in the different passages. Similarly, although the various figures and descriptions thereof relate to specific embodiments of the invention, it is to be understood that where a specific feature is disclosed in the context of a particular figure, such feature can also be used, to the extent appropriate, in the context of another figure, in combination with another feature, or in the invention in general.

What is claimed is:

1. A method of forming a metal electrode on a ceramic or glass substrate, comprising the steps of:
   (a) providing (i) a ceramic or glass substrate having a surface on which an electrode is to be formed and (ii) a combination of a metal source and a source of reducing carbon, with the proviso that at least one of the substrate and the combination is an absorber of microwave radiation;
   (b) coating the surface on which the electrode is to be formed with the combination; and
   (c) irradiating the coated substrate with sufficient microwave radiation to effect carbothermic reduction of the metal source to metal, to form a metal electrode on the surface of the substrate.

2. A method according to claim 1, wherein the substrate is a varistor having zinc oxide as its primary metal oxide.

3. A method according to claim 1, wherein the substrate is a ferroelectric material.

4. A method according to claim 1, wherein the substrate is a piezoelectric ceramic, positive temperature coefficient ceramic, negative temperature coefficient ceramic or a ceramic having a resistivity which varies with the ambient concentration of a gas.

5. A method according to claim 1, wherein the substrate is a barium titanate ceramic.

6. A method according to claim 5, wherein the barium titanate ceramic has a positive temperature coefficient.

7. A method according to claim 1, wherein the metal source is an oxide, hydroxide, carboxylate, formate, nitrate, nitrite, amine complex, carbonate, or mineral of a metal selected from the group consisting of zinc, copper, manganese, chromium, iron, cadmium, cobalt, nickel, bismuth, antimony, tin, lead, silver, gold, platinum, and combinations thereof.

8. A method according to claim 1, wherein the metal source is selected from the group consisting of zinc oxide, tin oxide, bismuth oxide, and copper oxide.

9. A method according to claim 1, wherein the source of reducing carbon is selected from the group consisting of carbohydrates, graphite, carbon black, furfuryl alcohol and derivatives thereof, hydrocarbon oligomers and polymers, polyacrylates, polyesters, polyimides, polyamides, polyethers, stearic acid derivatives, and combinations thereof.

10. A method according to claim 1, wherein the source of reducing carbon is a mono-, oligo- or polysaccharide.

11. A method according to claim 1, wherein the metal source further comprises elemental metal dispersed therein.

12. A method according to claim 1, wherein the combination of the metal source and the source of reducing carbon is an absorber of microwave radiation.

13. A method according to claim 12, wherein the substrate is not an absorber of microwave radiation.

14. A method according to claim 1, wherein, prior to the irradiating step, a further substrate is contacted against the combination of the metal source and source of reducing carbon such that at least some of the combination is disposed between the two substrates, so that after irradiation a metal electrode bonding the two substrates together is formed.

15. A method according to claim 14, wherein the two substrates are varistors having zinc oxide as the primary metal oxide.

16. A method according to claim 14, wherein the two substrates are barium titanate ceramics.

17. A method according to claim 14, wherein the two substrates are piezoelectric ceramics.

18. A method according to claim 14, wherein one substrate is a varistor having zinc oxide as its primary metal oxide and the other substrate is a piezoelectric ceramic.

19. A method according to claim 14, wherein one substrate is a varistor having zinc oxide as its primary metal oxide and the other substrate is a ceramic having a positive temperature coefficient.

20. A method according to claim 14, wherein the metal source is an oxide, hydroxide, carboxylate, formate, nitrate, nitrite, amine complex, carbonate, or mineral of a metal selected from the group consisting of zinc, copper, manganese, chromium, iron, cadmium, cobalt, nickel, bismuth, antimony, tin, lead, silver, gold, platinum, and combinations thereof.

21. A method according to claim 14, wherein the metal source is zinc oxide, copper oxide, tin oxide, or bismuth oxide.

22. A method according to claim 14, wherein the source of reducing carbon is selected from the group consisting of carbohydrates, graphite, carbon black, furfuryl alcohol and derivatives thereof, hydrocarbon oligomers and polymers, polyacrylates, polyesters, polyimides, polyamides, polyethers, stearic acid derivatives, and combinations thereof.

23. A method according to claim 14, wherein the source of reducing carbon is a mono-, oligo- or polysaccharide.

24. A method according to claim 14, wherein the metal source further comprises elemental metal dispersed therein.

25. A method according to claim 14, wherein the combination of the metal source and the source of reducing carbon is an absorber of microwave radiation.

26. A method according to claim 25, wherein the substrate is not an absorber of microwave radiation.

* * * * *